United States Patent
Baluja et al.

(10) Patent No.: US 8,455,849 B2
(45) Date of Patent: Jun. 4, 2013

(54) METHOD AND APPARATUS FOR MODULATING WAFER TREATMENT PROFILE IN UV CHAMBER

(75) Inventors: Sanjeev Baluja, Campbell, CA (US); Juan Carlos Rocha-Alvarez, San Carlos, CA (US); Alexandros T. Demos, Fremont, CA (US)

(73) Assignee: Applied Materials, Inc., Santa Clara, CA (US)

( * ) Notice: Subject to any disclaimer, the term of this patent is extended or adjusted under 35 U.S.C. 154(b) by 45 days.

(21) Appl. No.: 13/301,558

(22) Filed: Nov. 21, 2011

(65) Prior Publication Data

US 2012/0132618 A1    May 31, 2012

Related U.S. Application Data

(60) Provisional application No. 61/418,065, filed on Nov. 30, 2010.

(51) Int. Cl.
| | |
|---|---|
| *G01N 21/23* | (2006.01) |
| *G02B 13/14* | (2006.01) |
| *G02B 21/16* | (2006.01) |
| *C23C 16/48* | (2006.01) |

(52) U.S. Cl.
USPC ......... 250/504 R; 250/365; 216/66; 359/361; 359/275; 118/723 R; 427/553

(58) Field of Classification Search
USPC ............. 250/504 R, 365; 216/66; 359/361, 359/275; 118/723 R; 427/553
See application file for complete search history.

(56) References Cited

U.S. PATENT DOCUMENTS

| | | | |
|---|---|---|---|
| 5,986,747 A | 11/1999 | Moran | |
| 6,187,133 B1 | 2/2001 | Knoot | |
| 7,630,859 B2 * | 12/2009 | Harvey | 702/182 |
| 7,670,945 B2 | 3/2010 | Huang | |
| 7,851,054 B2 * | 12/2010 | Weber et al. | 428/220 |
| 7,901,870 B1 * | 3/2011 | Wach | 430/321 |
| 2008/0066778 A1 | 3/2008 | Matsushita et al. | |
| 2009/0255921 A1 | 10/2009 | Ranish et al. | |
| 2010/0018548 A1 | 1/2010 | Yi et al. | |

OTHER PUBLICATIONS

International Search Report and Written dated Jun. 29, 2012 for PCT International Application No. PCT/US2011/061703.

* cited by examiner

*Primary Examiner* — Nikita Wells
(74) *Attorney, Agent, or Firm* — Patterson & Sheridan, LLP

(57) ABSTRACT

A method and apparatus for providing a uniform UV radiation irradiance profile across a surface of a substrate is provided. In one embodiment, a substrate processing tool includes a processing chamber defining a processing region, a substrate support for supporting a substrate within the processing region, an ultraviolet (UV) radiation source spaced apart from the substrate support and configured to transmit ultraviolet radiation toward the substrate positioned on the substrate support, and a light transmissive window positioned between the UV radiation source and the substrate support, the light transmissive window having an optical film layer coated thereon. In one example, the optical film layer has a non-uniform thickness profile in a radial direction, wherein a thickness of the optical film layer at the peripheral area of the light transmissive window is relatively thicker than at the center region of the optical film layer.

18 Claims, 9 Drawing Sheets

METHOD AND APPARATUS FOR MODULATING WAFER TREATMENT PROFILE IN UV CHAMBER

CROSS-REFERENCE TO RELATED APPLICATIONS

This application claims benefit of U.S. provisional patent application Ser. No. 61/418,065, filed Nov. 30, 2010, which is herein incorporated by reference.

BACKGROUND OF THE INVENTION

1. Field of the Invention

Embodiments of the invention generally relate to an ultraviolet (UV) cure chamber. More particularly, embodiments of the invention relate to methods and apparatus for providing a uniform UV radiation irradiance profile across a surface of a substrate placed in the UV cure chamber.

2. Description of the Related Art

Materials with low dielectric constants (low-k), such as silicon oxides ($SiO_x$), silicon carbide ($SiC_x$), and carbon doped silicon oxides ($SiO_xC_y$), find extremely widespread use in the fabrication of semiconductor devices. Using low-k materials as the inter-metal and/or inter-layer dielectric between conductive interconnects reduces the delay in signal propagation due to capacitive effects. The lower the dielectric constant of the dielectric layer, the lower the capacitance of the dielectric and the lower the RC delay of the integrated circuit (IC).

Current efforts are focused on developing low-k dielectric materials, often referred to as ultra low-k (ULK) dielectrics, with k values less than 2.5 for the most advanced technology needs. Ultra low-k dielectric materials may be obtained by incorporating air voids within a low-k dielectric matrix, creating a porous dielectric material. Methods of fabricating porous dielectrics typically involve forming a "precursor film" containing two components: a porogen (typically an organic material such as a hydrocarbon) and a structure former or dielectric material (e.g., a silicon containing material). Once the precursor film is formed on the substrate, the porogen component can be removed, leaving a structurally intact porous dielectric matrix or oxide network.

Techniques for removing porogens from the precursor film include, for example, a thermal process in which the substrate is heated to a temperature sufficient for the breakdown and vaporization of the organic porogen. One known thermal process for removing porogens from the precursor film includes a UV curing process to aid in the post treatment of CVD silicon oxide films. Current UV curing process is performed by a UV lamp 10 having an elongated UV bulb 12 mounted within a housing 14, as shown in FIG. 8. The housing 14 may include one or more reflectors 16 that face UV bulb 12 and direct UV radiation into a flood pattern 18 over a round substrate 20. While the reflector 16 reflects the majority of radiation that strikes its surface within flood pattern 18, some radiation escapes the reflector surface and falls outside the boundaries of pattern 18 covering the substrate (see FIG. 8). One way to solve this issue is to rotate the UV lamp about the center of the substrate during curing such that the substantially rectangular exposure pattern generated by the UV lamp can compensate for illumination loss at the periphery of the substrate, thereby enhance the uniformity of illumination in the substrate plane. With time, however, the output of this arrangement still produces a large peak at the center of the substrate since the UV radiation at the center is more normal to the substrate, and the UV radiation at the edge is more oblique or weak. While the peak can be somewhat modulated using reflectors (not shown, typically disposed between the UV lamp and the substrate), the film profile of the substrate will still be center high unless the UV radiation is blocked. Blocking the light obviously reduces the overall efficiency of the UV source, which is not desirable.

In addition, the use of the housing 14 and the reflectors may inevitably produce lights that are incident on the surface of a UV vacuum window, which is disposed within the processing region and sealed to the housing 14 to maintain vacuum. The lights travelling through the UV vacuum window are reflected both when going from air to glass and at the other side of the UV vacuum window when going from glass back to air. The amount of light reflected is known as the "reflection loss," which also negatively affects the center to edge treatment non-uniformity on the substrate.

Therefore, there exists a need in the art for a UV chamber that can be used to effectively cure films deposited on substrates while improving the film uniformity and the throughput.

SUMMARY OF THE INVENTION

Embodiments of the invention generally provide apparatuses and methods for providing a uniform UV radiation irradiance profile across a surface of a substrate. In one embodiment, a substrate processing tool is provided. The tool generally includes a processing chamber defining a processing region, a substrate support for supporting a substrate within the processing region, an ultraviolet (UV) radiation source spaced apart from the substrate support and configured to transmit ultraviolet radiation toward the substrate positioned on the substrate support, and a light transmissive window positioned between the UV radiation source and the substrate support, the light transmissive window having an optical film layer coated thereon. In one example, the optical film layer has a non-uniform thickness profile in a radial direction, wherein a thickness of the optical film layer at the peripheral area of the light transmissive window is relatively thicker than at the center region of the optical film layer.

In another embodiment, a method of providing a uniform UV radiation irradiance profile across a surface of a substrate placed in a processing chamber is provided. The method generally includes providing a processing chamber defining a processing region, the processing chamber having an UV radiation source, and transmitting ultraviolet radiation emitted from the UV radiation source through a light transmissive window toward the substrate disposed on a substrate support, wherein the light transmissive window is coated with a first optical film layer and a thickness of the first optical film layer is modulated such that the periphery of the substrate disposed underneath the light transmissive window receives higher UV irradiance than the center region of the substrate.

In yet another embodiment, a light transmissive window used in an ultraviolet processing chamber is provided. The light transmissive window generally includes a window body having a first surface and a second surface, the first surface being parallel and opposite to the second surface, and the window body being configured to maintain vacuum of the ultraviolet processing chamber, the window body comprises an optical film layer deposited on the first and/or the second surface of the window body, the optical film layer having a non-uniform thickness profile in a radial direction, wherein a thickness of the optical film layer at the peripheral area of the window body is relatively thicker than at the center region of the first optical film layer, and wherein the optical film layer comprises a single anti-reflective coating (ARC) layer or a laminated ARC film stack with alternating layers of contrasting refractive index.

BRIEF DESCRIPTION OF THE DRAWINGS

So that the manner in which the above-recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

To facilitate understanding, identical reference numerals have been used, where possible, to designate identical elements that are common to the figures. It is contemplated that elements disclosed in one embodiment may be beneficially utilized on other embodiments without specific recitation.

DETAILED DESCRIPTION

Embodiments of the invention provides a processing chamber used for UV curing, in which a tandem processing chamber provides two separate and adjacent process regions in a chamber body and a lid having one or more UV vacuum windows aligned respectively above each process region. In various embodiments, the UV vacuum window may be coated with an optical film layer to improve transmission of the desired wavelengths and modulate the distribution of UV radiation across the substrate by manipulating the compositions and thickness of the optical film layer, thereby providing an edge-high irradiance profile of the substrate to compensate for the existing treatment profile that is center high. The compositions and thickness of the optical film layer may be tailored based on the incidence angle of the UV radiation, wavelength, and/or the irradiance intensity.

Exemplary Hardware

Figure 1:
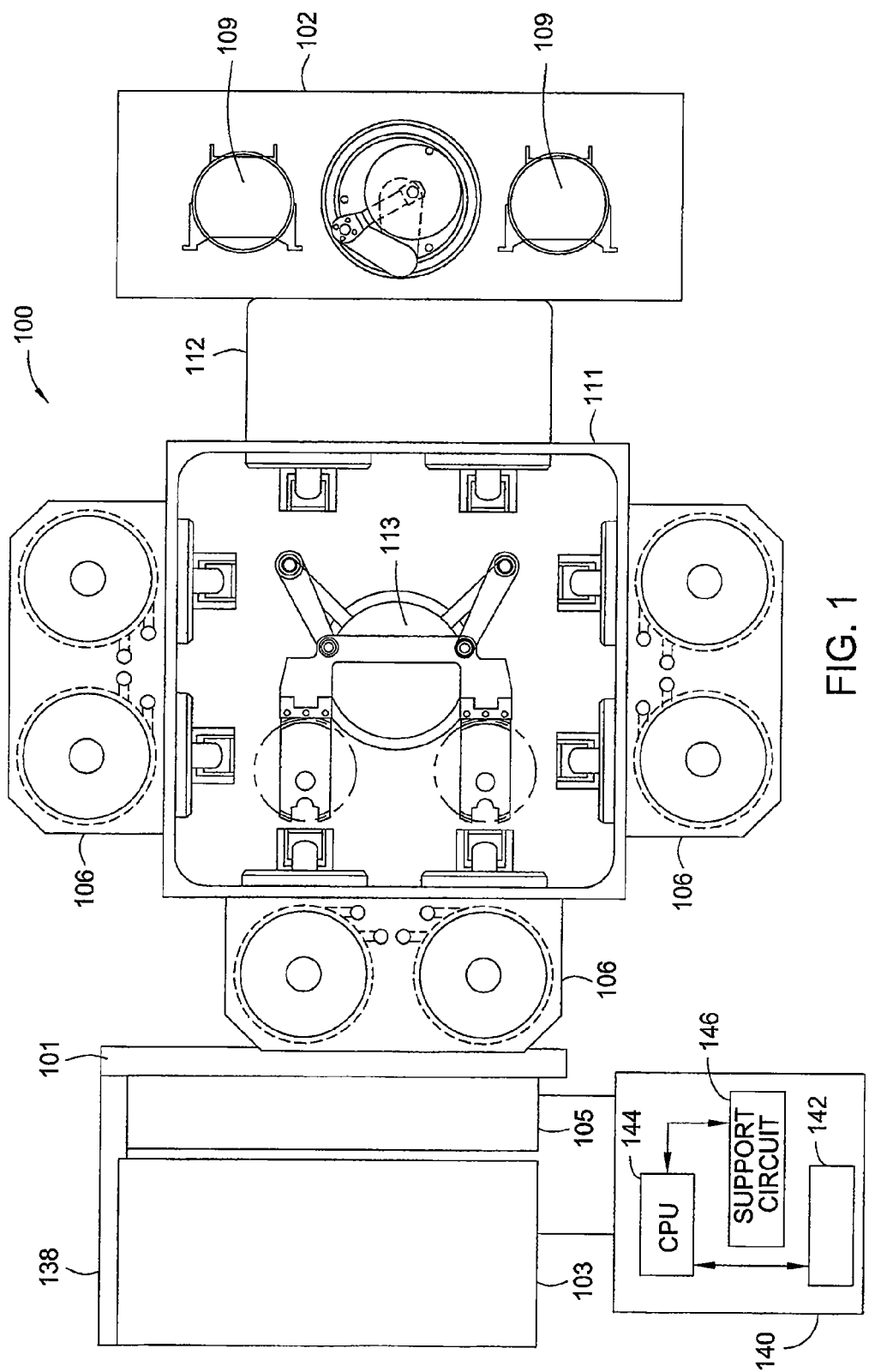
FIG. 1 is a plan view of a semiconductor processing system in which embodiments of the invention may be incorporated.

FIG. 1 shows a plan view of a semiconductor processing system 100 which may use embodiments of the invention. The system 100 illustrates an exemplary embodiment of a 300 mm Producer™ processing system, commercially available from Applied Materials, Inc., of Santa Clara, Calif. The processing system 100 is a self-contained system having the necessary processing utilities supported on a mainframe structure 101. The processing system 100 generally includes a front end staging area 102 where substrate cassettes 109 are supported and substrates are loaded into and unloaded from a loadlock chamber 112, a transfer chamber 111 housing a substrate handler 113, a series of tandem processing chambers 106 mounted on the transfer chamber 111 and a back end 138 which houses the support utilities needed for operation of the system 100, such as a gas panel 103, and a power distribution panel 105.

Figure 3:
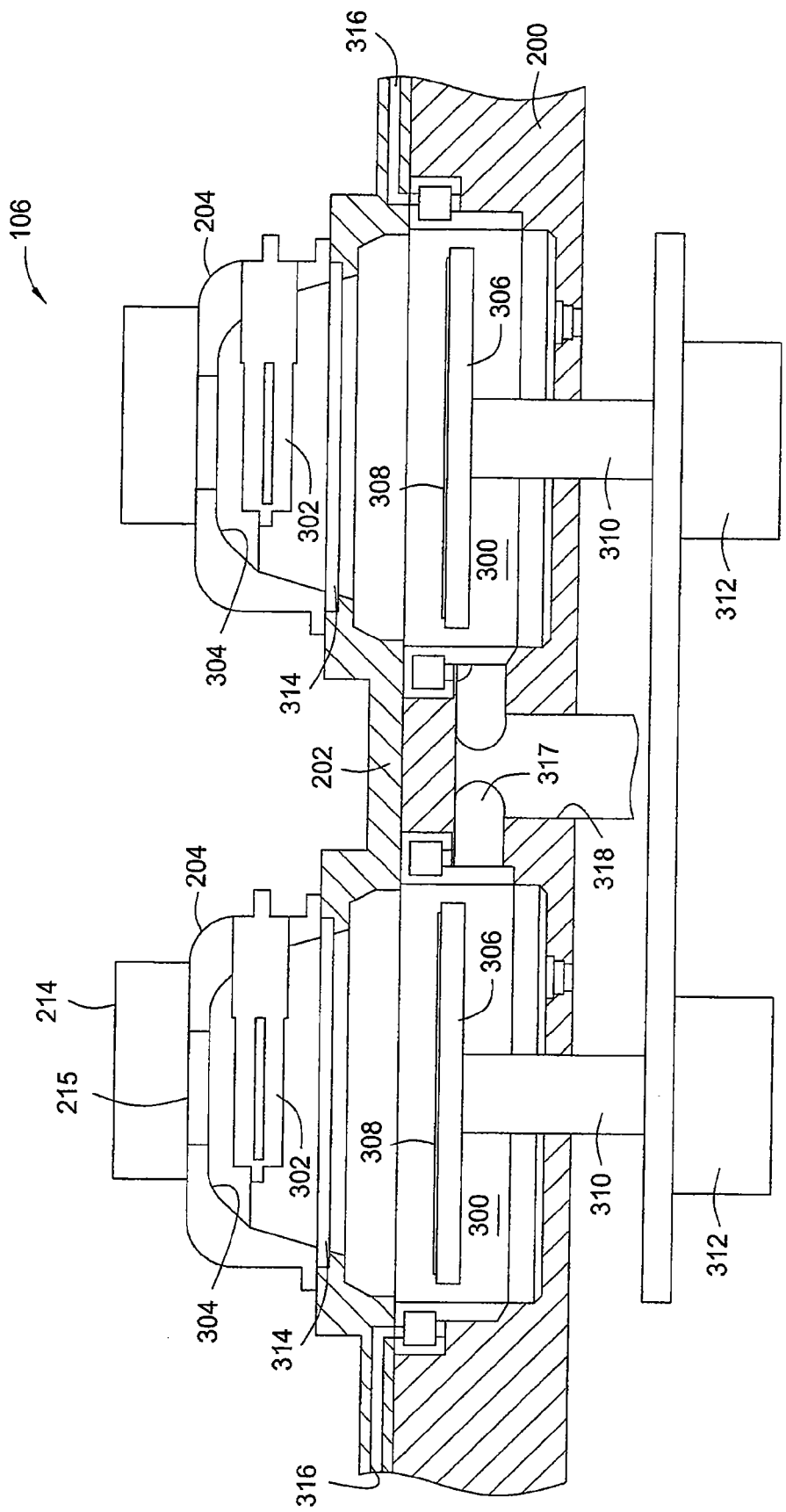
FIG. 3 is a partial section view of the tandem processing chamber that has a lid assembly with two UV bulbs disposed respectively above two processing regions.

Each of the tandem processing chambers 106 includes two process regions for processing the substrates (FIG. 3). The two process regions share a common supply of gases, common pressure control, and common process gas exhaust/pumping system. Modular design of the system enables rapid conversion from any one configuration to any other. The arrangement and combination of chambers may be altered for purposes of performing specific process steps. Any of the tandem processing chambers 106 can include a lid according to aspects of the invention as described below that includes one or more ultraviolet (UV) lamps for use in a cure process of a low K material on the substrate and/or in a chamber clean process. In one embodiment, all three of the tandem processing chambers 106 have UV lamps and are configured as UV curing chambers to run in parallel for maximum throughput.

In an alternative embodiment where not all of the tandem processing chambers 106 are configured as UV curing chambers, the system 100 can be adapted with one or more of the tandem processing chambers having supporting chamber hardware known to accommodate various other known processes such as chemical vapor deposition (CVD), physical vapor deposition (PVD), etch, and the like. For example, the system 100 can be configured with one of the tandem processing chambers 106 as a CVD chamber for depositing materials, such as a low dielectric constant (K) film, on the substrates. Such a configuration can maximize research and development fabrication utilization and, if desired, eliminate exposure of as-deposited films to atmosphere.

A controller 140, including a central processing unit (CPU) 144, a memory 142, and support circuits 146, is coupled to the various components of the semiconductor processing system 100 to facilitate control of the processes of the present invention. The memory 142 can be any computer-readable medium, such as random access memory (RAM), read only memory (ROM), floppy disk, hard disk, or any other form of digital storage, local or remote to the semiconductor processing system 100 or CPU 144. The support circuits 146 are coupled to the CPU 144 for supporting the CPU in a conventional manner. These circuits include cache, power supplies, clock circuits, input/output circuitry and subsystems, and the like. A software routine or a series of program instructions stored in the memory 142, when executed by the CPU 144, causes the UV curing tandem processing chambers 106 to perform processes of the present invention.

Figure 2:
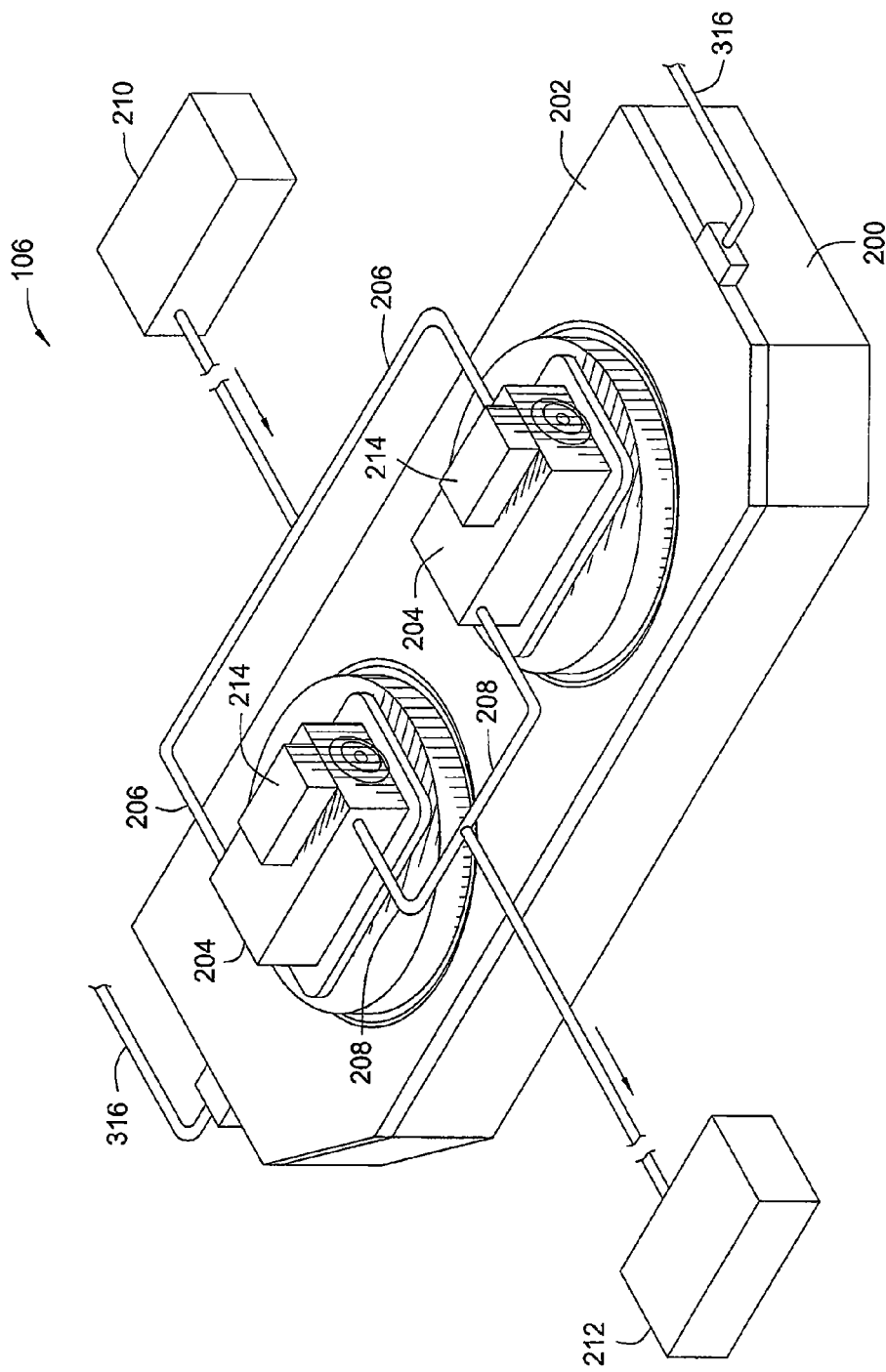
FIG. 2 is a view of a tandem processing chamber of the semiconductor processing system that is configured for UV curing.

FIG. 2 illustrates one of the tandem processing chambers 106 of the semiconductor processing system 100 that is configured for UV curing. The tandem processing chamber 106 includes a body 200 and a lid 202 that can be hinged to the body 200. The chamber body 200 may be made from aluminum. Coupled to the lid 202 are two housings 204 that are each coupled to inlets 206 along with outlets 208 for passing cooling air through an interior of the housings 204. A central pressurized air source 210 provides a sufficient flow rate of air to the inlets 206 to insure proper operation of any UV lamp bulbs and/or power sources 214 for the bulbs associated with the tandem processing chamber 106. Each of the housings 204 includes an aperture 215 adjacent the power sources 214 to receive microwave power from the power sources 214. The outlets 208 receive exhaust air from the housings 204, which is collected by a common exhaust system 212 that can include a scrubber to remove ozone potentially generated by the UV bulbs, depending on bulb selection.

FIG. 3 shows a partial section view of the tandem processing chamber 106 with the lid 202, the housings 204 and the power sources 214. Each of the housings 204 cover a respective one of more UV lamp bulbs 302 disposed respectively above two process regions 300 defined within the body 200. Each of the process regions 300 includes a heating substrate support, such as pedestal 306, for supporting a substrate 308 within the process regions 300. The pedestals 306 can be made from ceramic or metal such as aluminum. The pedestals 306 may couple to stems 310 that extend through a bottom of the body 200 and are operated by drive systems 312 to move the pedestals 306 in the process regions 300 toward and away from the UV lamp bulbs 302. The drive systems 312 can also rotate and/or translate the pedestals 306 during curing to further enhance uniformity of substrate illumination.

In general, any UV source such as mercury microwave arc lamps, pulsed xenon flash lamps or high-efficiency UV light emitting diode arrays may be used. The UV lamp bulbs 302 are sealed plasma bulbs filled with one or more gases such as xenon (Xe) or mercury (Hg) for excitation by the power sources 214. In one embodiment where UV lamp bulbs 302 are used as UV source, the UV lamp bulbs 302 can include an electrode or filament therein such that the power sources 214 represent circuitry and/or current supplies, such as direct current (DC) or pulsed DC, to the electrode. In certain embodiments, the power sources 214 may include radio frequency (RF) energy sources that are capable of excitation of the gases within the UV lamp bulbs 302 to increase bulb brilliancy by generation of plasma.

Various concepts for enhancing uniformity of substrate illumination include use of lamp arrays which can also be used to vary wavelength distribution of incident light, relative motion of the substrate and lamp head including rotation and periodic translation (sweeping), and real-time modification of lamp reflector shape and/or position. Depending upon application, the bulbs 302 are chosen to emit light across a broad band of wavelengths from 170 nm to 400 nm. In one embodiment of the invention, the bulbs 302 emit light at wavelengths from 185 nm to 255 nm. The gases selected for use within the bulbs 302 can determine the wavelengths emitted. While single bulbs is depicted, an array of UV lamp bulbs may be disposed. The array of UV lamps can include as few as two bulbs powered by a single power source or separate power sources. In one aspect, the array of UV lamps includes a first bulb for emitting a first wavelength distribution and a second bulb for emitting a second wavelength distribution. The curing process can thus be controlled by defining various sequences of illumination with the various lamps within a given curing chamber in addition to adjustments in gas flows, composition, pressure, substrate temperature, and/or various coating profiles on UV vacuum window or transparent showerhead surfaces, as will be discussed below in conjunction with FIGS. 7A-7D and 9. In addition on a multi-curing chamber system, the curing process can be further refined by defining sequences of treatments in each of the tandem curing chambers each of which is controlled independently with respect to parameters such as lamp spectrum, substrate temperature, ambient gas composition and pressure for the specific portion of the cure for which each is used.

Substrates are brought into the process region 300, to perform a post-treatment cure of dielectric films deposited on the substrate 308. The films may be low-k dielectric films having porogen including, for example, a silicon backbone structure and carbon within the film. In operation, UV light emitted from the UV lamp bulbs 302 enters the process regions 300 by passing through one or more UV vacuum windows 314 disposed in apertures in the lid 202. The UV vacuum windows 314 may be made of an OH free synthetic quartz glass and have sufficient thickness (e.g., 1 inch) to maintain vacuum without cracking. The UV vacuum window 314 may have a diameter of about 200 mm to about 375 mm and a thickness of about 25.4 mm. The surface of the UV vacuum window 314 may be deposited with a single anti-reflective coating (ARC) layer or a laminated ARC film stack with alternating layers of contrasting refractive index. The surface of the UV vacuum window 314 may be polished to provide a desired surface finish of about 1.2 to about 3.6 microinch (μin). In one embodiment, the UV vacuum windows 314 are fused silica that transmits UV light down to approximately 150 nm. Since the lid 202 seals to the body 200 and the windows 314 are sealed to the lid 202, the process regions 300 provide volumes capable of maintaining pressures from approximately 1 Torr to approximately 650 Torr. Processing or cleaning gases then enter the process regions 300 via a respective one of two inlet passages 316 and exit the process regions 300 via a common outlet port 318. Additionally, the cooling air supplied to the interior of the housings 204 circulates past the bulbs 302, but is isolated from the process regions 300 by the UV vacuum windows 314. After UV exposure, the carbon bonds break and the carbon outgases from the film, leaving a silicon backbone, and increasing porosity which decreases the k value and reduces the current carrying capacity of the film.

The housings 204 may include an interior parabolic or elliptical surface defined by a cast quartz lining 304 (serve as a primary reflector) coated with a dichroic film. The UV lamp bulbs 302 is partially surrounded by the quartz lining 304 used to reflect UV light emitted from the UV lamp bulbs 302. The UV light are shaped to suit the cure processes as well as the chamber clean processes based on the pattern of UV light directed by the quartz linings 304 into the process regions 300. The quartz linings 304 may adjust to better suit each process or task by moving and changing the shape of the interior parabolic surface. Additionally, the quartz linings 304 may transmit infrared light and reflect ultraviolet light emitted by the bulbs 302 due to the dichroic film. The dichroic film usually constitutes a periodic multilayer film composed of diverse dielectric materials having alternating high and low refractive index. Since the coating is non-metallic, microwave radiation from the power sources 214 that is downwardly incident on the backside of the cast quartz linings 304 does not significantly interact with, or get absorbed by, the modulated layers and is readily transmitted for ionizing the gas in the bulbs 302.

In one embodiment, the enhancement of the uniformity of illumination in the substrate plane may be achieved by rotating the UV lamp about the center of the substrate during curing such that the substantially rectangular exposure pattern generated by the UV lamp can compensate for illumination loss at the periphery of the substrate. In another embodiment, rotating or otherwise periodically moving the quartz linings 304 during curing and/or cleaning may also enhance the uniformity of illumination in the substrate plane. Alternatively, the entire housings 204 may rotate or translate periodically over the substrates 308 while the quartz linings 304 are stationary with respect to the bulbs 302. In still another embodiment, rotation or periodic translation of the substrates 308 via the pedestals 306 provides the relative motion between the substrates 308 and the bulbs 302 to enhance illumination and curing uniformity, depending upon the requirements of an application.

Figure 4:
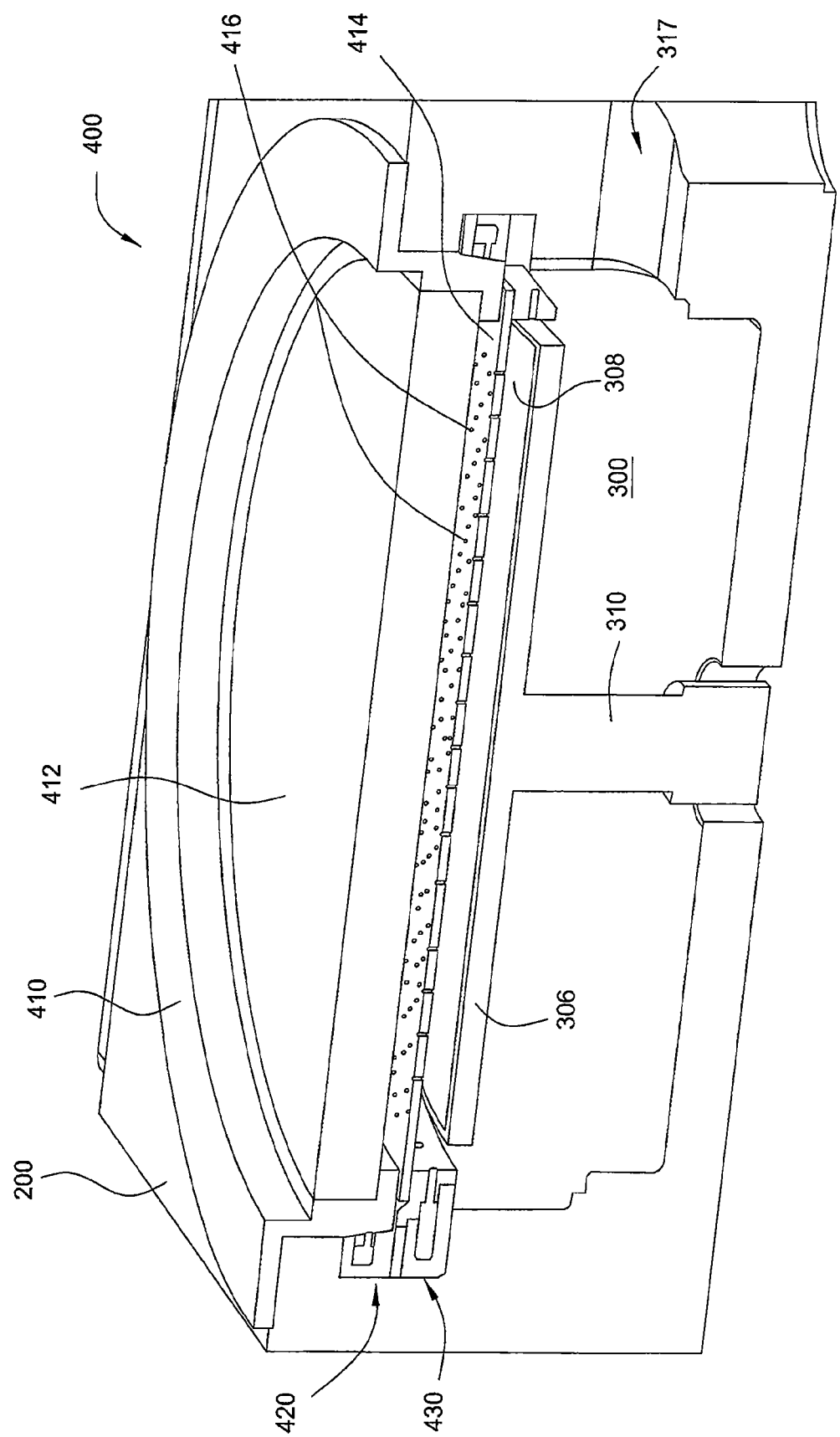
FIG. 4 is a schematic isometric cross-sectional view of a portion of one of the processing chambers without the lid assembly.

To enable control of the gas flow profile throughout the processing chamber, a design of hardware that enables a specific gas flow profile distribution across the substrate 308 being processed in a UV chamber, lamp heated chamber, or other chamber where "light" energy is used to process a film or catalyze a reaction, either directly on or above the substrate 308. As shown in FIG. 4, a window assembly is positioned within the processing chamber 400 to hold the UV vacuum window 412. The window assembly includes a vacuum window clamp 410 that rests on a portion of the body 200 and supports the UV vacuum window 412 through which UV light may pass from the UV lamp bulbs 302, which is part of the lid assembly above the body 200. The UV vacuum window 412 is positioned between the UV radiation source, such as UV lamp bulbs 302, and the pedestal 306. The UV radiation source is spaced apart from the pedestal 306 and configured to generate and transmit ultraviolet radiation to a substrate 308 positioned on the pedestal 306.

In one embodiment, a transparent showerhead 414 is positioned within the processing region 300 and between the UV vacuum window 412 and the pedestal 306. The transparent showerhead defines an upper processing region 320 (FIG. 5A) between the vacuum window 412 and transparent showerhead 414 and further defines a lower processing region 322 between the transparent showerhead 414 and the pedestal 306. The transparent showerhead 414 has one or more passages 416 formed therethrough so that the upper processing region 320 is in fluid communication with the lower processing regions 322. The passages 416 may have a roughened surface 418, sometimes referred to as "frosted", so that the passages 416 are not perfectly transparent, which otherwise could potentially cause shadows on the substrate 308 and impair proper curing of the film. The frosted passages 416 diffuse the UV light so there is no light pattern on the substrate 308 during processing.

Figures 5A, 5B:
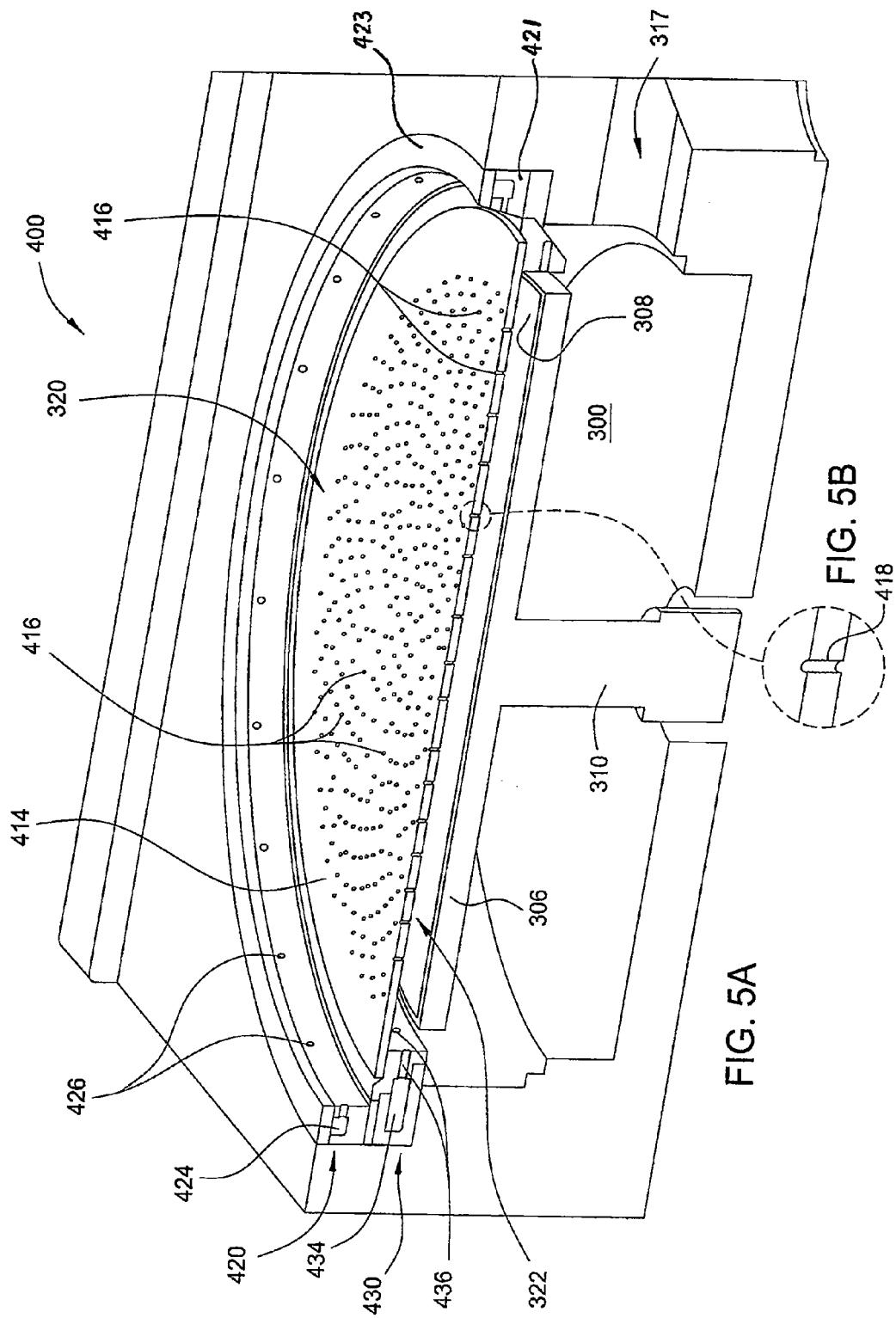
FIG. 5A is a schematic isometric cross-sectional view of the processing chamber in FIG. 4 without the window assembly.
FIG. 5B is a close up of the cross-section of the showerhead shown in FIG. 5A.

The transparent showerhead 414 may serve as a second UV window through which UV light may pass to reach the substrate 308. As a second UV window, the showerhead 414 may be transparent to the wavelengths of light desired for curing the film on the substrate 308. The transparent showerhead may be formed of various transparent materials such as quartz or sapphire. The passages 416 may be formed by drilling holes through a quartz piece to form and shape the transparent showerhead 414 to fit within the processing region 300. The surface of the quartz piece may be flame polished whereas the drilled holes may be etched to form the roughened surface 418 (FIG. 5B). The size and density of the passages 416 may be uniform or non-uniform to effectuate the desired flow characteristics across the substrate surface. The passages 416 may have either a uniform flow profile where the flow per radial area across the substrate 308 is uniform or the gas flow can be preferential to the center or edge of the substrate 308.

A gas distribution ring 420 made of aluminum oxide is positioned within the processing region 300 proximate to the sidewall of the UV chamber. The gas distribution ring 420 may comprise a base distribution ring 421 and a gas inlet ring 423. The base distribution ring 421 may have one or more gas distribution ring passages 426. The one or more gas distribution ring passages 426 couple an inner cavity 424 of the gas distribution ring 420 with the upper processing region 320, forming a gas flow path between the inner cavity 424 and the upper processing region 320 above the transparent showerhead 414. A gas outlet ring 430 is positioned relatively below the gas distribution ring 420 and the transparent showerhead 414 within the processing region 300 proximate to the sidewall of the UV chamber. The gas outlet ring 430 also has one or more gas outlet passages 436 coupling an inner cavity 434 of the gas outlet ring 430 with the lower processing region 322, forming a gas flow path between the lower processing region 322 and the gas outlet inner cavity 434.

Figure 6:
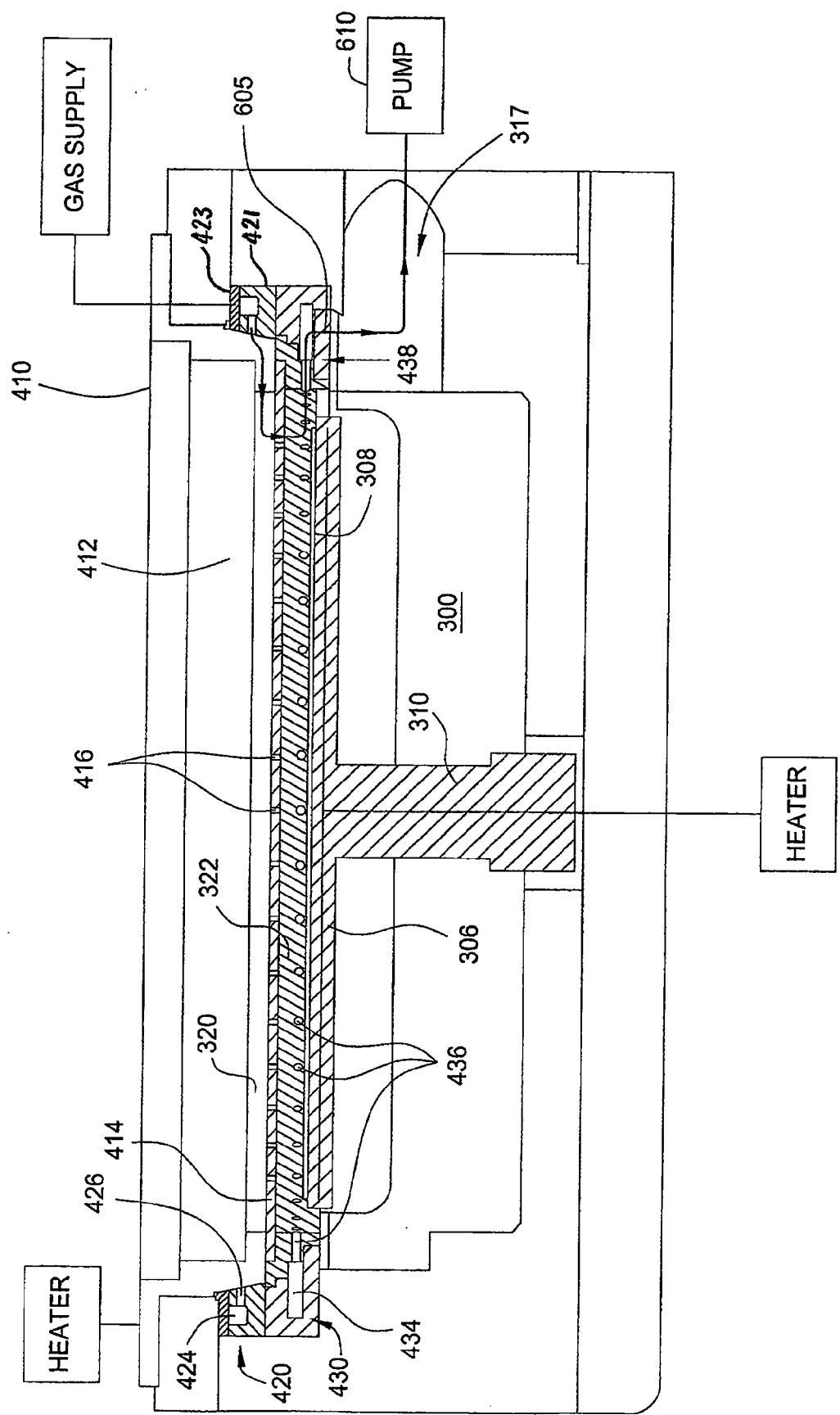
FIG. 6 is a schematic cross-sectional view of the processing chamber in FIG. 5A illustrating a gas flow path.

FIG. 6 depicts a schematic cross-sectional view of the processing chamber in FIG. 5A illustrating a gas flow path. Purge gas or other types of gases may be injected into the upper processing region 320 between the UV vacuum window 412 and the transparent showerhead 414, through the transparent showerhead 414, and down towards the substrate from the transparent showerhead 414. The size of the passages 416, 426, 436 and gas flow rates may be adjusted so that a back pressure forms to even out the flow down towards the substrate 308. The gas flow washes over the substrate from above, spreads out concentrically, and exits the lower processing region 322 through gas outlet passages 436 and to a pump 610. Arrows 605 depict the gas flow path from the gas distribution ring 420, through the transparent showerhead 414, over the substrate 308, through the gas outlet ring 430, and exiting the chamber 400. In one example, the gas may enter an gas inlet formed in the gas inlet ring 423 and flow through the gas distribution ring inner channel 424 and out the passages 426 of the gas outlet ring 430. The gas fills the volume above the transparent showerhead 414, e.g. the upper processing region 320, and flows through the showerhead passages 416. The gas then flows concentrically and radially across substrate 308 to the gas outlet passages 436. The gas then is ejected from the lower processing region 322, enters the gas outlet ring inner channel 434, flows through the inner channel 434, and exits the gas outlet 438 into a gas exhaust port 317 and to the pump 610.

The density and size of the passages 416, 426, 436 may be adjusted to increase or decrease the gas flow velocity as desired. Depending on the pattern of the passages 416 in the showerhead 414, the flow may be uniform (proportional to the substrate area) or preferential toward the center or edge. Thus, the gas flow profile may be controlled across the substrate 308 to provide a desired uniform or non-uniform distribution. Additionally, the temperature profile across the substrate 308 may also be controlled to be uniform or non-uniform, providing the ability to not only to create uniform gas flow and temperature profiles across the substrate, but to create and control a desired non-uniform gas and temperature profile. A more detailed description/benefits of the window assembly, particularly the transparent showerhead 414 and related components, is further described in the commonly assigned U.S. patent application Ser. No. 13/248,656 filed on Sep. 29, 2011 by Baluja et al., which is incorporated by reference in its entirety.

Selectively Coated UV Window

Figure 8:
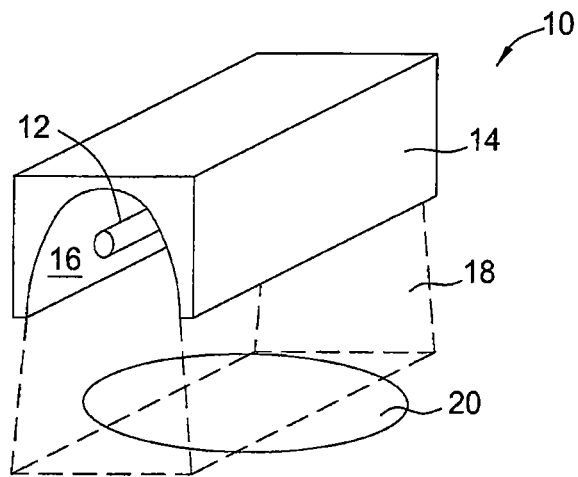
FIG. 8 is a perspective view of a prior art UV lamp that illustratively depicts a flood pattern generated by the lamp over a round substrate.

As indicated previously, the conventional UV curing process produces a non-uniform UV illumination intensity center-to-edge in the substrate plane due to the fact that some portions of the substrate may fall outside the boundaries of the rectangular flood pattern generated by the UV lamp 10 during the process (see FIG. 8). In addition, the use of the housing 14 and the reflectors may inevitably produce lights that are incident on the surface of the UV vacuum window, which would cause the "reflection loss" at interfaces when lights travelling through the UV vacuum window and thus negatively affects the center to edge treatment non-uniformity on the substrate. To solve the issue, the present inventors have proposed various approaches to provide an edge-high irradiance profile of the substrate without blocking the UV radiation. It should be understood that the optical coating layer as shown in FIGS. 7A-7D is not drawn to scale and have been exaggerated for illustration purposes.

In various embodiments, an optical coating layer is selectively deposited on one side or both sides of the UV vacuum window 314 to improve transmission of the desired wavelengths and modulate the distribution of UV radiation across the substrate. In one example, the optical coating layer is deposited on the top side (facing the UV source) of the UV vacuum window 314. The optical coating layer may be an organic or a dielectric material. In one embodiment, the optical coating layer is an anti-reflective coating (ARC) used to reduce reflection when UV radiation passing through the UV vacuum window 314. The optical coating layer may be a transparent layer so that the optical waves reflected from both boundaries of this layer will cancel each other. The ARC layer is typically chosen to reduce or eliminate any reflected light waves by three aspects of the ARC material—a refraction index (n), an absorption index (k), and the thickness (t) of the ARC to create a phase cancellation and absorption of reflected light. The required n, k, and t values may vary depending upon the thickness and properties of the underlying object and need adjustment for each particular application, as will be discussed below. An ARC layer therefore provides a smoother transition from one medium to another, and can even be used to provide zero reflection at a selected wavelength.

The distribution of radiance power through the UV vacuum window 314 may be controlled by manipulating the compositions and thickness of the ARC layer deposited on the UV vacuum window 314 based on the incidence angle of the radiation, wavelength, and/or the irradiance intensity. Thickness of the ARC layer can be modulated center to edge to modify the UV irradiance profile relative to irradiance intensity and incidence angle. The thickness of the ARC layer may be adjusted as appropriate for its refractive index to maximize absorption over the desired wavelength spectrum. In one embodiment, the ARC layer may be deposited on the UV vacuum window 314 in a way to provide a center-to-edge treatment non-uniformity having edge-high irradiance profile of the substrate. The ARC layer may be a single film layer or a laminated ARC film stack with alternating layers of contrasting refractive index, depending upon the radiation wavelength (at a single or multiple wavelengths) in a wide range of frequencies such as IR, visible, or UV. That is, the ARC layer may serve as a bandpass filter to obtain better transmissive for the wavelengths of interest over a broader bandpass. The coating properties of the ARC layer can be skewed such that the diametric efficiency of the ARC layer varies with the incident angle of the radiation. Since the UV radiation at the center is more normal to the UV vacuum window/ARC layer, and the UV radiation at the edge is more oblique, a non-uniform coating will cause a high center-to-edge compensation profile. A non-uniform ARC layer center-to-edge can be optimized along the radius for specific incidence angles, which in turn controls the amount of radiation transmitting the UV vacuum window and thus the distribution of the radiation across the substrate disposed underneath because the curing rate is proportional to the amount of radiation received by the substrate disposed underneath.

Figure 7A:
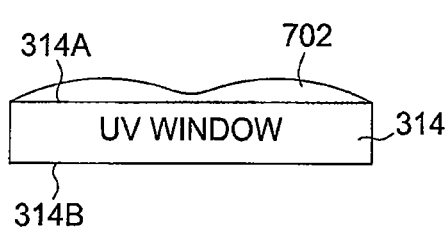
FIGS. 7A-7D illustrate cross-sectional views of a simplified UV vacuum window or transparent showerhead having an optical film layer deposited thereon in accordance with various embodiments of the present invention.

To provide an edge-high irradiance profile of the substrate, in one embodiment shown in FIG. 7A, an ARC layer 702 may be deposited on the UV vacuum window 314 in a way that the thickness of the ARC layer at the edge is relatively thicker than at the center region of the UV vacuum window 314 in a radial direction, such that the periphery of the substrate (not shown) disposed underneath the UV vacuum window 314 receives higher UV irradiance than the center to compensate for the existing treatment non-uniformity issue that is center high. Any suitable technique may be used to obtain such a non-uniform thickness profile. For example, a shadow frame or the like (not shown) may be used during the deposition to mask the center region of the UV vacuum window 314 from the depositing material. Alternatively, a masking material (not shown) or the like may be disposed onto a top side 314A and around the periphery of the UV vacuum window 314 prior to deposition of the ARC layer to achieve an edge-high ARC layer on the UV vacuum window 314. In either case, the overall thickness of the ARC layer 702 may be controlled at between about 30 nm and about 3000 nm, such as about 50 nm and about 1000 nm. In one embodiment, the overall thickness of the ARC layer 702 may vary between about 20 nm and about 800 nm at the center region of the UV vacuum window 314, and the thickness may be gradually increased from the center region to the periphery where the overall thickness is ranging between about 80 nm and about 2000 nm. The ARC layer 702 may be further polished and/or finished to obtain a desired thickness profile and/or film roughness. The ARC layer may be deposited on the top side 314A and/or bottom side 314B of the UV vacuum window 314.

Figure 7B:
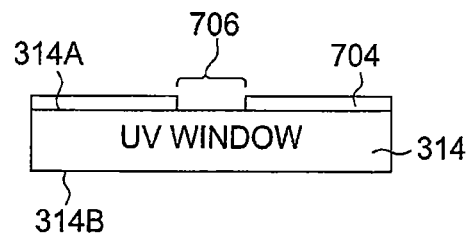
Figure 9:
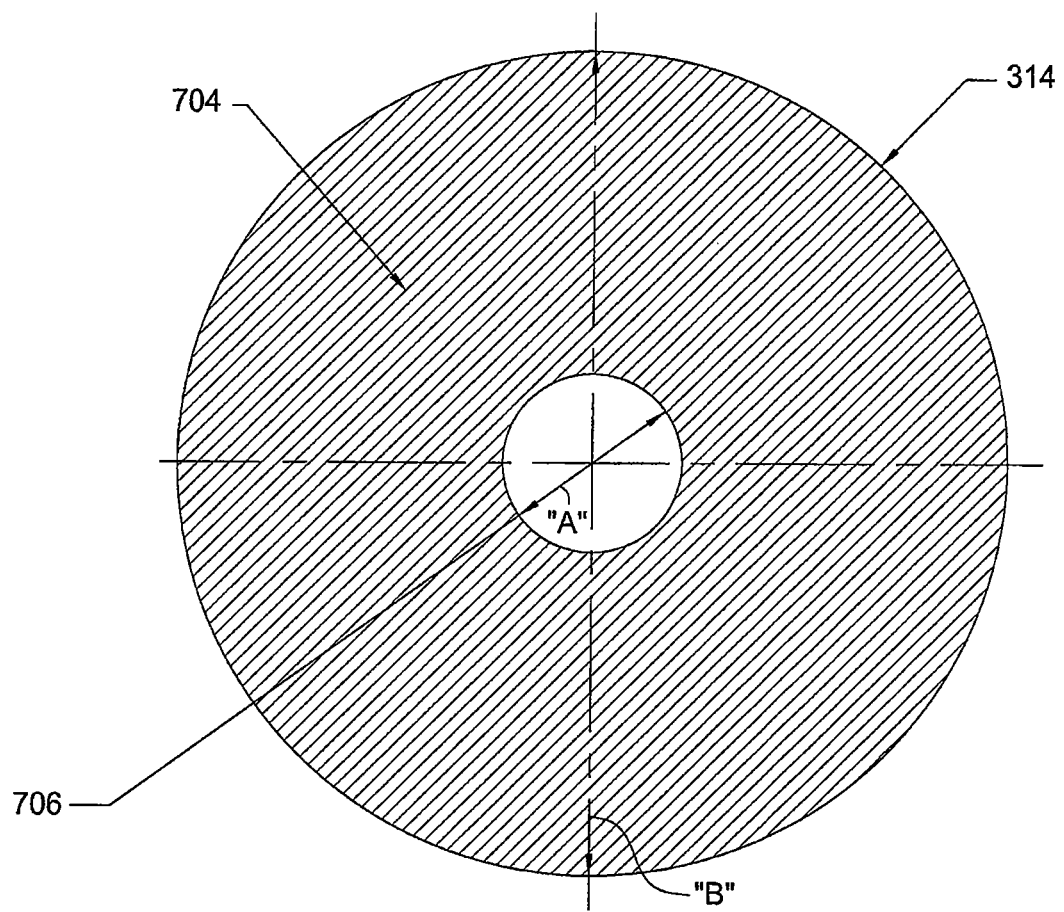
FIG. 9 is a top-view of a simplified UV vacuum window having an optical film layer deposited thereon in accordance with one embodiment of the present invention.

In an alternative embodiment, the ARC layer may be deposited at the peripheral region of the UV vacuum window 314, leaving the center of the UV vacuum window 314 uncoated as shown in FIG. 7B. This can be done by any suitable techniques such as a conventional lithography and an etching process. For example, a resist mask pattern (not shown) may be applied on a surface of an ARC layer 704 to develop and transfer desired patterns to the ARC layer using an appropriate chemical etchant, thereby obtaining one or more openings at the center region of the ARC layer 704. A top view of an exemplary UV vacuum window 314 having the center region 706 uncoated with the ARC layer 704 is shown in FIG. 9. While the center region 706 is shown with a circular shape uncoated, the center region 706 may be of any desired shape. The ratio of the center region 706 devoid of coating to the total area of the UV vacuum window 314 may be between about 30% and about 95%, such as between about 60% and about 85%, which may vary depending upon the desired irradiance profile on a substrate and/or the arrangement of the UV lamp. In one embodiment where the UV vacuum window 314 has a diameter "B" of about 375 mm and a thickness of about 25.4 mm, the center region 706 devoid of coating may be between about 50 mm and about 100 mm in diameter "A", for example, about 80 mm in diameter.

The ARC layer 702, 704 may be formed on the top side 314A and/or bottom side 314B of the UV vacuum window 314 by a PVD, CVD, or other suitable deposition techniques. The ARC layer 702, 704 may be any material with a desired film transmittance and refractive index. The ARC layer 702, 704 may be selected to have a refractive index between the refractive index of air and the refractive index of the UV vacuum window 314. In one embodiment, the ARC layer 702, 704 is selected to have a refractive index about 1.1. In various embodiments, the ARC layer 702, 704 may comprise an organic anti-reflective coating such as polyamide or the like, or a dielectric anti-reflective coating such as silicon nitride, titanium oxide, amorphous carbon material, etc., that can be used to assist in the transmission of light through the UV vacuum window 314 to the substrate 308 disposed underneath. Other suitable materials such as silicon oxynitride (SiON), tin oxide ($SnO_2$), silicon oxide ($SiO_2$), or combinations thereof may also be used for the ARC layer 702, 704.

After the ARC layer is formed on the UV vacuum window 314, the surface of the ARC layer 702, 704 may be polished to provide a film with desired surface finish, for example, about 1.2 to about 3.6 microinch (μin) finish. It is believed that a surface with a desirable finish/roughness may assist in trapping light that can be delivered through the UV vacuum window 314 to the substrate 308 disposed underneath. The surface of the ARC layer 702, 704 may be CMP polishing with a polishing fluid including, for example, $CeO_2$ or $Al_2O_3$. Alternatively, the surface of the ARC layer 702, 704 may be mechanically abraded and/or polished by any suitable manner available in the art. In one embodiment, the ARC layer 702, 704 is surface finished to have an average film roughness of between about 25 Ra and 50 Ra, for example about 30 Ra.

Figure 7C:
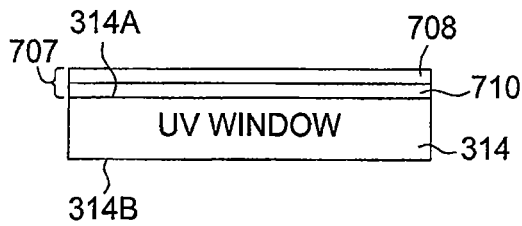

In yet another embodiment shown in FIG. 7C, an ARC layer 707 of a film stack comprising alternating layers of different refractive index may be formed on the top surface 314A of the UV vacuum window 314 such that only lights with certain spectrums may pass. The ARC layer 707 may serve as a bandpass filter in which the material/refractive index of the layer is specifically chosen to reflect IR and allow UV to pass (or vice versa), thereby modulating the film uniformity by controlling the amount of light transmitting the UV vacuum window 314, which in turn effects the curing rate. The curing rate is generally proportional to the amount of light received by the substrate. In one example, the ARC layer 707 generally includes a first layer 708 and a second layer 710, which is formed on a top surface 314A of the UV vacuum window 314. The first and second layer 708, 710 may be chosen from any of the materials discussed above with respect to FIGS. 7A and 7B. The first layer 708 may be a silicon oxide layer ($SiO_2$) and the second layer 710 is a titanium oxide ($TiO_2$) layer or a tin oxide layer ($SnO_2$) or vise versa. In one example, the first layer 708 formed in the ARC layer 707 is a silicon oxide layer ($SiO_2$) and the second layer 710 is a titanium oxide ($TiO_2$) layer. In another example, the film stack may include repeated silicon oxide ($SiO_2$) and titanium oxide ($TiO_2$) layers. For example, the film stack may have a first pair of a first silicon oxide ($SiO_2$) layer and a first titanium oxide ($TiO_2$) layer and a second pair having a second silicon oxide layer ($SiO_2$) and a second titanium oxide ($TiO_2$) layer consecutively formed on the UV vacuum window 314. The first layer of silicon oxide layer ($SiO_2$) and the second layer of titanium oxide ($TiO_2$) layer may be repeatedly formed as many times as needed.

In various embodiments, the thickness of the first and second layers 708, 710 of the ARC layer 707 may be controlled to the point where they are applied in increments of one-quarter or one-half the wavelength of specific radiation. The first layer 708 may have a thickness of about 10 nm and about 3000 nm and the second layer 710 may have a thickness of about 5 nm and about 2000 nm. The overall thickness of the ARC layer may be controlled at between about 30 nm and about 3000 nm, such as about 50 nm and about 1000 nm. If desired, the film stack of the ARC layer may be formed in a similar way as discussed above with respect to FIGS. 7A and 7B to provide a non-uniform thickness profile.

Figure 7D:
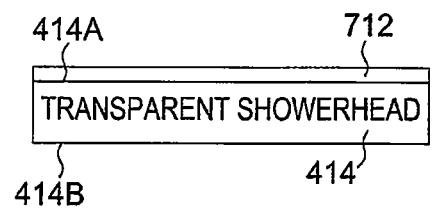

Various approaches discussed in FIGS. 7A-7C may be similarly applied to the transparent showerhead 414 (FIG. 4) to compensate transmission efficiency loss caused by the light reflection when the lights traveling through the transparent showerhead 414. Top side 414a and/or bottom side 414b of the transparent showerhead 414 can be coated with an optical film layer 712 to transmission efficiency of desired wavelengths, as shown in FIG. 7D. The optical film layer 712 may be an anti-reflective coating (ARC) or a film stack, as discussed above with respect to FIGS. 7A-7C. Alternatively, the optical film layer 712 may be a dichroic coating to reflect UV and allow IR to pass. The optical film layer 712 may be formed by PVD, CVD, or other suitable deposition techniques.

In addition to various approaches used for transmission of the desired wavelengths and thus the distribution of UV radiation across the substrate, the present inventors have also found that an infrared absorption layer may be deposited at the peripheral area of the UV vacuum window 314 to prevent liquid based precursors, residues, or porogen outgassed from the substrate from condensation on the UV vacuum window 314 during a UV curing process.

Figure 10A:
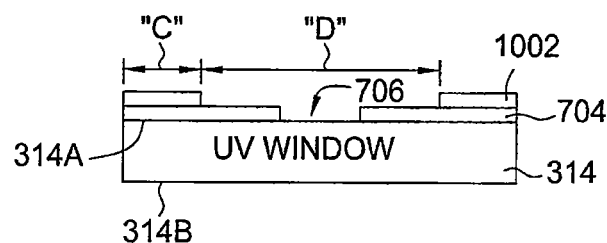
FIG. 10A is a schematic cross-sectional view of a UV vacuum window of FIG. 7B having an infrared absorption layer deposited at the peripheral area of an ARC layer.

In one embodiment shown in FIG. 10A, a UV vacuum window 314 with the center region 706 uncoated with the ARC layer 704 (FIGS. 7B and 9) is provided and an infrared absorption layer 1002 may be deposited at the peripheral area of the ARC layer 704. A shadow frame or the like (not shown) may be used during the deposition to mask the center area of the UV vacuum window 314 from the depositing material onto the central portion of the ARC layer 704 (including the uncoated center region 706). The infrared absorption layer 1002 increases in temperature from absorbing the infrared energy and heats the UV vacuum window 314 to a temperature above the precursors' or residues' condensation temperature. Thus, any condensation of the vaporized precursors/residues is prevented.

In cases where the UV vacuum window 314 has a diameter of about 375 mm, the center region 706 which remains devoid of the ARC layer 704 may be between about 50 mm and about 100 mm in diameter, for example, about 80 mm in diameter, and the infrared absorption layer 1002 deposited on the peripheral area of the ARC layer 704 may have a constant radial width "C" of about 20 mm to about 80 mm along the circumference of the UV vacuum window 314, defining the uncoated center area "D" of about 75 mm to about 120 mm in diameter.

Figure 10B:
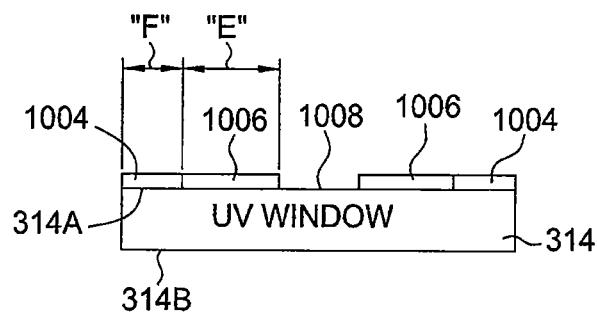
FIG. 10B is a schematic cross-sectional view of a UV vacuum window having an infrared absorption layer and an ARC layer deposited thereon at substantially the same elevation.

In an alternative embodiment as shown in FIG. 10B, an infrared absorption layer 1004 and the ARC layer 1006 may be deposited onto the top side 314A of the UV vacuum window 314 at substantially the same elevation. The ARC layer 1006 may be deposited radially inward of the infrared absorption layer 1004, leaving the center region 1008 uncoated with the ARC layer 1006. That is, the infrared absorption layer 1004 is deposited at the peripheral area of the UV vacuum window 314 in a manner so as to surround the ARC layer 1006, which completely surrounds and encloses the uncoated center region 1008. In cases where the UV vacuum window 314 has a diameter of about 375 mm, the center region 1008 uncoated with the ARC layer 1006 may be between about 50 mm and about 100 mm in diameter, for example, about 80 mm in diameter. The ARC layer 1006 may have a constant radial width "E" of about 20 mm to about 60 mm along the circumference of the UV vacuum window 314, and the infrared absorption layer 1004 may have a constant radial width "F" of about 20 mm to about 80 mm along the circumference of the UV vacuum window 314.

In various embodiments discussed above, the infrared absorption layer 1002, 1004 may comprise material having high infrared absorption in the wavelength range between 750 and 20,000 nm. The infrared absorption layer 1002, 1004 may be, for example, polysubstituted phthalocyanine compounds, cyanine dyes, merocyanine dyes, etc., inorganic pigments, such as carbon black, graphite, chromium dioxide, etc., or metal, such as aluminum, copper, etc. Other suitable materials may be used as long as the application of the material layer can result in a temperature increase of the UV vacuum window 314.

Embodiments of the invention have been proved to be able to reduce the Fresnel losses at the surfaces of the UV vacuum window, improving the efficiency of the system as much as 4-10%. Various embodiments of the present invention improve transmission efficiency of desired wavelengths and the center-to-edge treatment uniformity on a substrate by adjusting the composition or thickness of a coating layer deposited on the UV vacuum window, without blocking the UV radiation. The proposed invention enables the periphery of the substrate receiving higher UV irradiance than the center to compensate for the existing treatment problem that is center high. Particularly, the throughput of this system is also increased because it allows for higher efficiency of the curing process.

While the foregoing is directed to embodiments of the invention, other and further embodiments of the invention may be devised without departing from the basic scope thereof.

What is claimed is:

1. A substrate processing tool, comprising:
a processing chamber defining a processing region;
a substrate support for supporting a substrate within the processing region;
an ultraviolet (UV) radiation source spaced apart from the substrate support and configured to transmit ultraviolet radiation toward the substrate positioned on the substrate support;
a light transmissive window positioned between the UV radiation source and the substrate support, the light transmissive window having a first optical film layer coated thereon; and
wherein the first optical film layer has a non-uniform thickness profile in a radial direction, wherein a thickness of the first optical film layer at the peripheral area of the light transmissive window is relatively thicker than at the center region of the first optical film layer.

2. The processing tool of claim 1, wherein the first optical film layer comprises a single anti-reflective coating (ARC) layer or a laminated ARC film stack with alternating layers of contrasting refractive index.

3. The processing tool of claim 1, wherein the first optical film layer has an overall thickness of about 20 nm to about 600 nm at the center region and an overall thickness of about 80 nm to about 2000 nm at the peripheral area.

4. The processing tool of claim 1, wherein the center region of the light transmissive window is uncoated with the first optical film layer.

5. The processing tool of claim 4, wherein the center region has a diameter of about 50 mm to about 100 mm.

6. The processing tool of claim 1, wherein the first optical film layer is coated on a first surface of the light transmissive window facing the UV radiation source, a second surface of the light transmissive window facing the substrate support, or on both the first and second surfaces of the light transmissive window.

7. The processing tool of claim 2, wherein the single anti-reflective coating (ARC) layer comprises an organic anti-reflective coating or a dielectric anti-reflective coating.

8. The processing tool of claim 2, wherein the laminated ARC film stack comprises a first layer and a second layer, the first layer being a silicon oxide layer ($SiO_2$) and the second layer being a titanium oxide ($TiO_2$) layer or a tin oxide layer ($SnO_2$).

9. The processing tool of claim 4, further comprises:
an infrared absorption layer deposited at the peripheral area of the first optical film layer.

10. The processing tool of claim 9, wherein the infrared absorption layer has a constant radial width of about 20 mm to about 80 mm along the circumference of the light transmissive window.

11. The processing tool of claim 1, further comprises:
a transparent showerhead positioned within the processing region between the light transmissive window and the substrate support and having one or more passages formed therethrough.

12. The processing tool of claim 11, wherein the transparent showerhead is coated with a second optical film layer comprising a single anti-reflective coating (ARC) layer, a laminated ARC film stack with alternating layers of contrasting refractive index, or a dichroic coating.

13. The processing tool of claim 12, wherein the second optical film layer is coated on a first surface of the transparent showerhead facing the UV radiaiton source, a second surface of the transparent showerhead facing the substrate support, or on both the first and second surfaces of the transparent showerhead.

14. A method of providing a uniform UV radiation irradiance profile across a surface of a substrate placed in a processing chamber, comprising:
providing a processing chamber defining a processing region, the processing chamber having an UV radiation source; and
transmitting ultraviolet radiation emitted from the UV radiation source through a light transmissive window toward the substrate disposed on a substrate support, wherein the light transmissive window is coated with a first optical film layer and a thickness of the first optical film layer is modulated such that the periphery of the substrate disposed underneath the light transmissive window receives higher UV irradiance than the center region of the substrate.

15. The method of claim 14, wherein the first optical film layer comprises a single anti-reflective coating (ARC) layer or a laminated ARC film stack with alternating layers of contrasting refractive index.

16. The method of claim 14, wherein the center region of the light transmissive window is uncoated with the first optical film layer.

17. The method of claim 14, further comprises:
depositing an infrared absorption layer at the peripheral area of the first optical film layer, wherein the infrared absorption layer has a constant radial width of about 20 mm to about 80 mm along the circumference of the light transmissive window.

18. A light transmissive window used in an ultraviolet processing chamber, comprising:
a window body having a first surface and a second surface, the first surface being parallel and opposite to the second surface, and the window body being configured to maintain vacuum of the ultraviolet processing chamber, the window body comprises:

an optical film layer deposited on the first and/or the second surface of the window body, the optical film layer having a non-uniform thickness profile in a radial direction, wherein a thickness of the optical film layer at the peripheral area of the window body is relatively thicker than at the center region of the first optical film layer, and wherein the optical film layer comprises a single anti-reflective coating (ARC) layer or a laminated ARC film stack with alternating layers of contrasting refractive index.

* * * * *

UNITED STATES PATENT AND TRADEMARK OFFICE
CERTIFICATE OF CORRECTION

PATENT NO. : 8,455,849 B2
APPLICATION NO. : 13/301558
DATED : June 4, 2013
INVENTOR(S) : Baluja et al.

It is certified that error appears in the above-identified patent and that said Letters Patent is hereby corrected as shown below:

In Claims:

Column 14, Claim 13, Line 29, please delete "radiaiton" and insert --radiation-- therefor.

Signed and Sealed this
Thirteenth Day of August, 2013

Teresa Stanek Rea
*Acting Director of the United States Patent and Trademark Office*